United States Patent
Chan et al.

(10) Patent No.: US 9,196,610 B1
(45) Date of Patent: Nov. 24, 2015

(54) SEMICONDUCTOR STRUCTURE AND ELECTROSTATIC DISCHARGE PROTECTION CIRCUIT

(71) Applicant: Macronix International Co., Ltd., Hsinchu (TW)

(72) Inventors: Wing-Chor Chan, Hsinchu (TW); Hsin-Liang Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/275,995

(22) Filed: May 13, 2014

(51) Int. Cl.
*H01L 29/66* (2006.01)
*H01L 27/02* (2006.01)
*H01L 29/78* (2006.01)

(52) U.S. Cl.
CPC ........ *H01L 27/0266* (2013.01); *H01L 29/7818* (2013.01)

(58) Field of Classification Search
CPC .................. H01L 27/0266; H01L 29/7818
USPC ........................................................ 257/328
See application file for complete search history.

(56) References Cited

U.S. PATENT DOCUMENTS

| | | | |
|---|---|---|---|
| 6,444,511 B1* | 9/2002 | Wu et al. ........................ | 438/199 |
| 2009/0140335 A1* | 6/2009 | Schneider et al. ............ | 257/344 |
| 2013/0182357 A1* | 7/2013 | Brodsky ........................ | 361/56 |

\* cited by examiner

*Primary Examiner* — Trung Q Dang
(74) *Attorney, Agent, or Firm* — McClure, Qualey & Rodack, LLP

(57) ABSTRACT

A semiconductor structure and an electrostatic discharge protection circuit are disclosed. The semiconductor structure includes a device structure comprising a first well region, a second well region, a source, a drain, an extending doped region, and a gate structure. The second well region has conductivity type opposite to a conductivity type of the first well region. The drain has a conductivity type same as a conductivity type of the source. The source and the drain are formed in the first well region and the second well region respectively. The extending doped region is adjoined with drain and extended under the drain. The extending doped region has a conductivity type same as the conductivity type of the drain. The gate structure is on the first well region.

18 Claims, 8 Drawing Sheets

SEMICONDUCTOR STRUCTURE AND ELECTROSTATIC DISCHARGE PROTECTION CIRCUIT

BACKGROUND

1. Technical Field

The invention relates to and more specifically to a semiconductor structure and more specifically to an electrostatic discharge protection circuit.

2. Description of the Related Art

Semiconductor devices are used in elements for many products such as MP3 players, digital cameras, computer, etc. As the application increases, the demand for the semiconductor device focuses on small size and large circuit density. In the semiconductor technology, the feature size has been reduced. In the meantime, the rate, the efficiency, the density and the cost per integrated circuit unit have been improved.

Recently, a power-saving IC is a trend for development for a semiconductor device. The power-saving IC usually uses a LDMOS or an EDMOS as a switch. For example, a method for increasing a breakdown voltage (BVdss) of a semiconductor device such as a LDMOS or an EDMOS is decreasing a dopant concentration of a drain region or increasing a drift length.

Electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor device, the semiconductor device is usually damaged due to high power density. Thus, the ESD protection device has to provide a discharge path to prevent the semiconductor device from being damaged when the electrostatic charges are generated in the semiconductor device by machine or human body.

SUMMARY

According to one embodiment, a semiconductor structure is disclosed, comprising a device structure comprising a first well region, a second well region, a source, a drain, an extending doped region, and a gate structure. The second well region has conductivity type opposite to a conductivity type of the first well region. The drain has a conductivity type same as a conductivity type of the source. The source and the drain are formed in the first well region and the second well region respectively. The extending doped region is adjoined with the drain and extended under the drain. The extending doped region has a conductivity type same as the conductivity type of the drain. The gate structure is on the first well region.

According to another embodiment, an electrostatic discharge protection circuit is provided, comprising a first MOS device and the second MOS device. Each of the first MOS device and the second MOS device comprises, a source, a drain, an active body, and a gate structure. The gate structure is on the active body between the source and the drain. A higher voltage terminal is coupled to the drains of the first MOS device and the second MOS device. A lower voltage terminal is coupled to the source and the gate structure of the first MOS device. The active body of the first MOS device is coupled to the source of the second MOS device.

According to yet another embodiment, a semiconductor structure is disclosed, comprising a first device structure and a second device structure, each of the first device structure and the second device structure comprising a first well region and/or a second well region, a source, a drain, and a gate structure. The source and the drain have a conductivity type same as a conductivity type of the second well region, and opposite to a conductivity type of the first well region. The gate structure is on the first well region between the source and the drain. The source of the first device structure, and the source and the drain of the second device structure are disposed in the common first well region.

DETAILED DESCRIPTION

Figure 1:
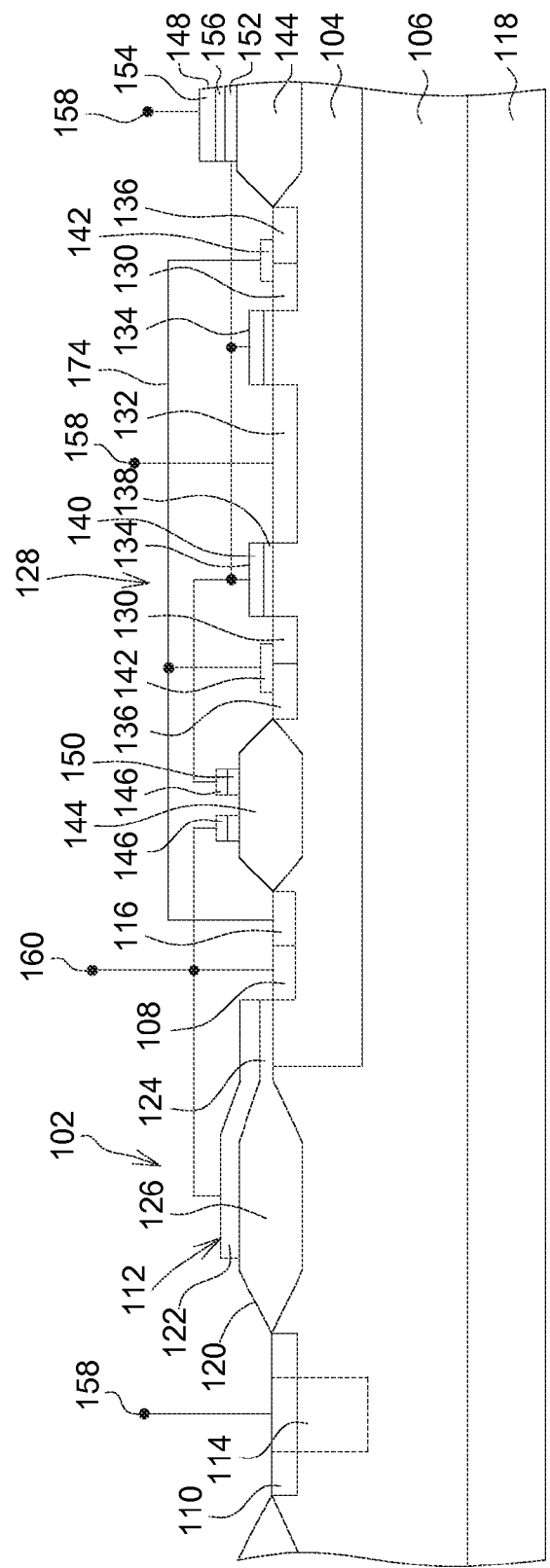
FIG. 1 illustrates a schematic cross-section diagram of a semiconductor structure according to an embodiment.
Figure 2:
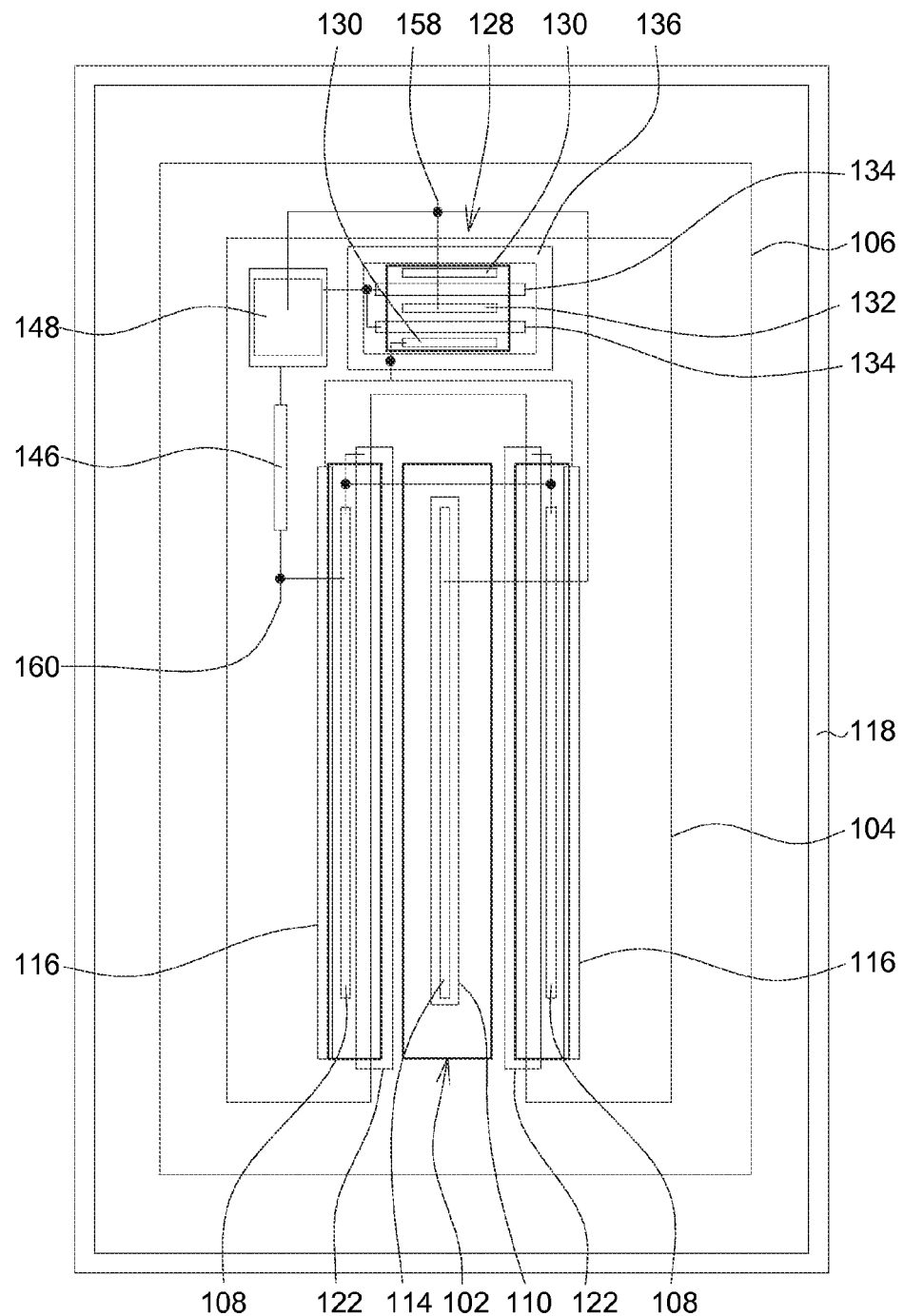
FIG. 2 illustrates a top view of the semiconductor structure according to an embodiment.

FIG. 1 illustrates a schematic cross-section diagram of a semiconductor structure according to an embodiment. FIG. 2 illustrates a top view of the semiconductor structure according to an embodiment.

Referring to FIG. 1 and FIG. 2, a first device structure 102 may comprise a first well region 104, a second well region 106, a source 108, a drain 110, a gate structure 112, an extending doped region 114 and a doped contact 116. The second well region 106 may be formed on a semiconductor substrate 118 having a conductivity type opposite to a conductivity type of the second well region 106. The first well region 104 may be formed in the second well region 106 having a conductivity type opposite to a conductivity type of the first well region 104 by a doping process. The source 108 and the drain 110 having the same conductivity type are formed in the first well region 104 and the second well region 106 respectively.

The gate structure 112 is formed on the first well region 104 and the second well region 106 between the source 108 and the second. In one embodiment, the gate structure 112 comprises a gate dielectric 120 and a gate electrode 122 on the gate dielectric 120. The gate dielectric 120 comprises a thinner dielectric portion 124 adjacent to the source 108, and a thicker dielectric portion 126 adjacent to the drain 110. For example, the thinner dielectric portion 124 may be formed by a method comprising a deposition, a thermal growth, or other suitable methods. The thicker dielectric portion 126 is not limited to a FOX structure, and can be a STI structure, or formed by other suitable techniques. In other embodiments, thin, thick, or partial thick dielectric materials such as an oxide, etc., may be selected for the gate dielectric 120.

The extending doped region 114 having a conductivity type same as the conductivity type of the drain 110 may be formed to be adjoined with and extended under the drain 110 by a doping method. In one embodiment, a lower surface of the extending doped region 114 is below a lower surface of the thicker dielectric portion 126 of the gate dielectric 120. The doped contact 116 is formed in the first well region 104, and has a conductivity type same as the conductivity type of the first well region 104.

A second device structure 128 may comprise the first well region 104, a source 130, a drain 132, a gate structure 134 and a doped contact 136. The source 130 and the drain 132 formed in the first well region 104 have a conductivity type opposite to the conductivity type of the first well region 104. The gate structure 134 is formed on the first well region 104 between the source 130 and the drain 132. The gate structure 134 comprises a gate dielectric 138 and a gate electrode 140 formed on the gate dielectric 138. The gate dielectric 138 is not limited to a thin dielectric material, and may use a thick dielectric material, such as an oxide, etc. The doped contact 136 is formed in the first well region 104 and has a conductivity type same as the conductivity type of the first well region 104. The doped contact 136 and the source 130 may have a commonly used conductive contact 142 on which.

As shown in FIG. 1 and FIG. 2, the source 108 of the first device structure 102, and the source 130 and the drain 132 of the second device structure 128 are formed in the commonly used first well region 104. An isolation structure 144 may be used for separating the first device structure 102 and the second device structure 128. The isolation structure 144 is not limited to a FOX structure, and may use a STI structure, or formed by other methods. The semiconductor structure further comprises a resistor 146 and a capacitor 148. For example, the resistor 146 may comprise polysilicon or other suitable materials, and may be formed on a dielectric layer 150. The capacitor 148 may be a structure formed by a dielectric layer 156 sandwiched between conductive films 152 and 154, such as a polysilicon-insulator-polysilicon capacitor (PIP capacitor). The capacitor 148 is coupled to the resistor 146 and the gate structure 134 of the second device structure 128. The source 130 of the second device structure 128 is coupled to the doped contact 116 and the doped contact 136.

In one embodiment, the first device structure 102 is an EDMOS device. The second device structure 128 is a low voltage (LV) MOS device, functioned as an electrostatic discharge protection device. For example, in cases of the first device structure 102 and the second device structure 128 both being N type devices, a higher voltage terminal (high pin) 158 is coupled to the capacitor 148 and the drain 110 of the first device structure 102 and the drain 132 of the second device structure 128, and a lower voltage terminal (low pin) 160 is coupled to the resistor 146 and the source 108 and the gate structure 112 of the first device structure 102.

The first well region 104 (for example having a P type conductivity type) arranged at side of the source 108 of the first device structure 102, having the conductivity type opposite the conductivity type of the source 108, can functioned as a pick-up structure, improving an electrostatic discharge protection efficiency of the semiconductor structure. The extending doped region 114, extended down from the lower surface of the drain 110 and having the conductivity type same as the conductivity type of the drain 110, can force an electrostatic discharge to flow toward a sub-surface, so as to improve electrostatic discharge protection efficiency of the semiconductor structure. A breakdown voltage and a trigger voltage of the first device structure 102 can be decreased by reducing a width of (or a channel length in) the (second well region 106 between the drain 110 and the first well region 104. In embodiments, the second device structure 128 is used to adjust a trigger voltage of the electrostatic discharge protection device, to make the electrostatic discharge protection device easily triggered during an electrostatic discharge issue. For example, a width an a length of the second device structure 128 can be adjusted to control the trigger voltage of the device.

Figure 3:
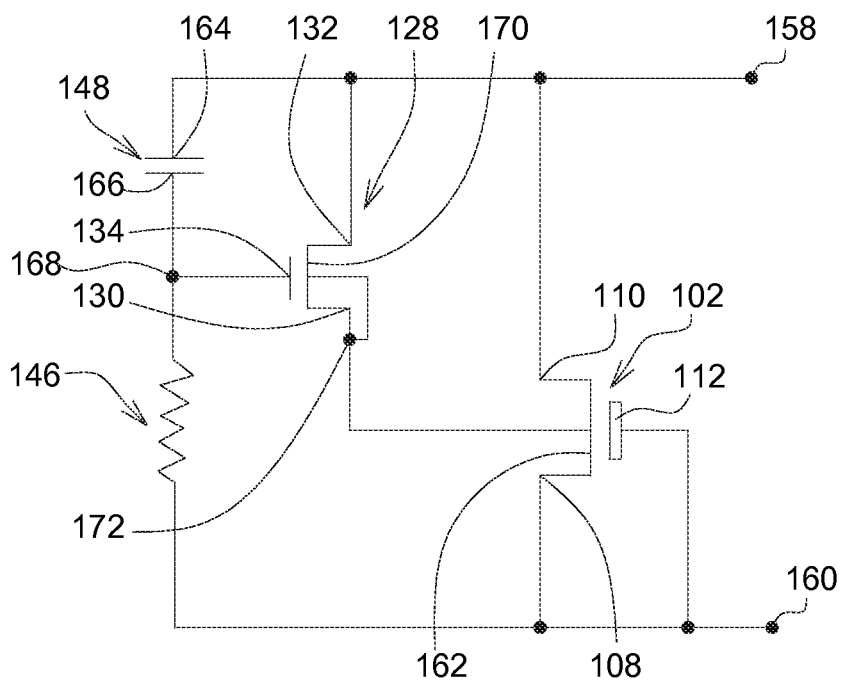
FIG. 3 illustrates an electrostatic discharge protection circuit according to an embodiment.

FIG. 3 illustrates an electrostatic discharge protection circuit according to an embodiment, which may indicate the semiconductor structure as shown in FIG. 1 or FIG. 2. The higher voltage terminal 158 is coupled to the drain 110 of the first device structure 102 (first MOS device) and the drain 132 of the second device structure 128 (second MOS device). The lower voltage terminal 160 is coupled to the source 108 and the gate structure 112 of the first device structure 102. An active body 162 (comprising the first well region 104 and the second well region 106 as shown in FIG. 1) of the first device structure 102 is coupled to the source 130 of the second device structure 128. Opposing electrodes 164 and 166 of the capacitor 148 are coupled to the drain 132 and the gate structure 134 of the second device structure 128 respectively. Two opposing sides of the resistor 146 are coupled to the source 108 of the first device structure 102 and the gate structure 134 of the second device structure 128. The capacitor 148 and the resistor 146 are coupled (electrically connected) in series between the higher voltage terminal 158 and the lower voltage terminal 160. A node (common voltage) 168 between the capacitor 148 and the resistor 146 is coupled to the gate structure 134 of the second device structure 128. An active body 170 (comprising the first well region 104 as shown in FIG. 1) and the source 130 of the second device structure 128 are coupled to a node (common voltage) 172.

Figure 4:
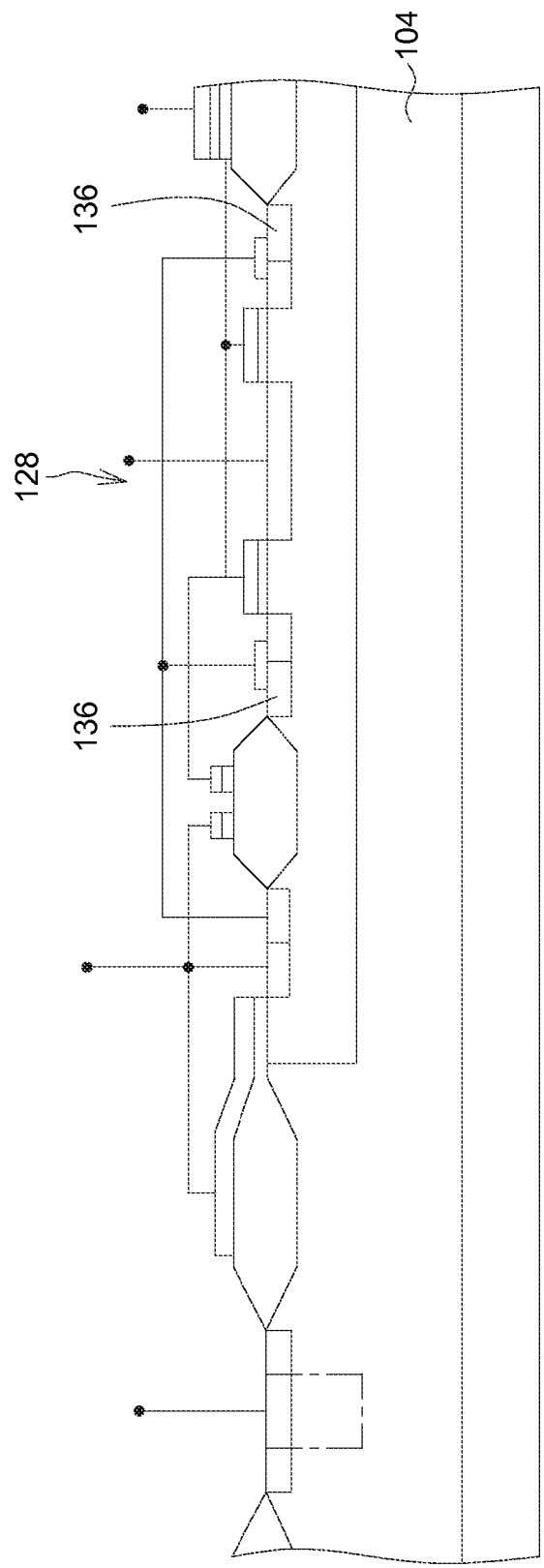
FIG. 4 illustrates a schematic cross-section diagram of a semiconductor structure according to an embodiment.

FIG. 4 illustrates a schematic cross-section diagram of a semiconductor structure according to an embodiment. Differences between the semiconductor structures of FIG. 1 and FIG. 4 are disclosed as following. The first well region 104 of the second device structure 128 may be functioned as a resistor by omitting a conductive element 174 as shown in FIG. 1.

Figure 5:
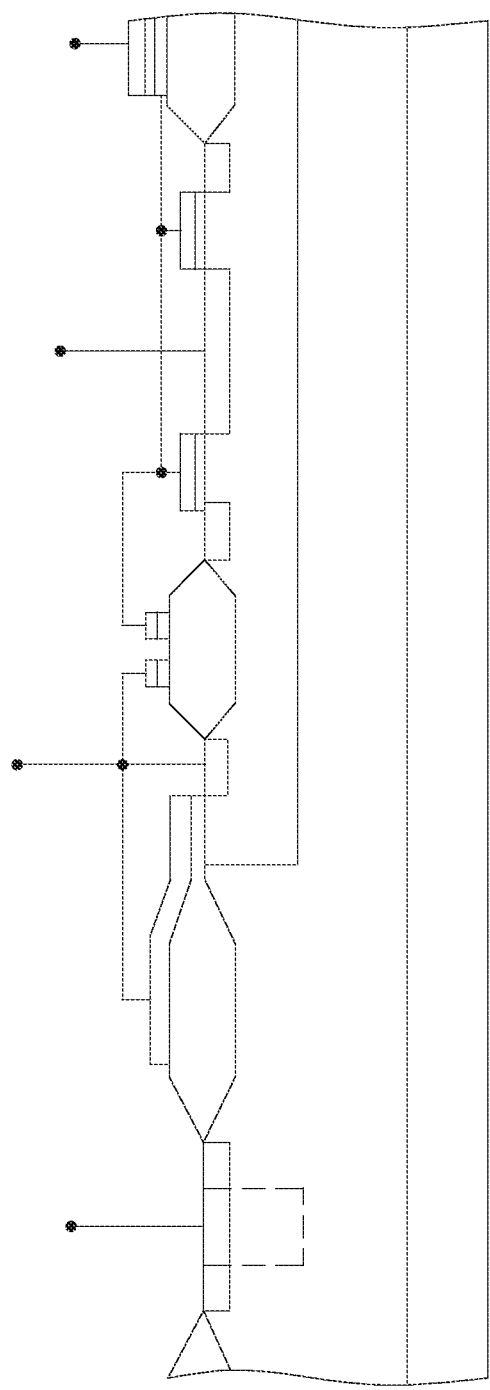
FIG. 5 illustrates a schematic cross-section diagram of a semiconductor structure according to an embodiment.

FIG. 5 illustrates a schematic cross-section diagram of a semiconductor structure according to an embodiment. Differences between the semiconductor structures of FIG. 5 and FIG. 4 are disclosed as following. The doped contact 136 as shown in FIG. 4 is omitted.

Figure 6:
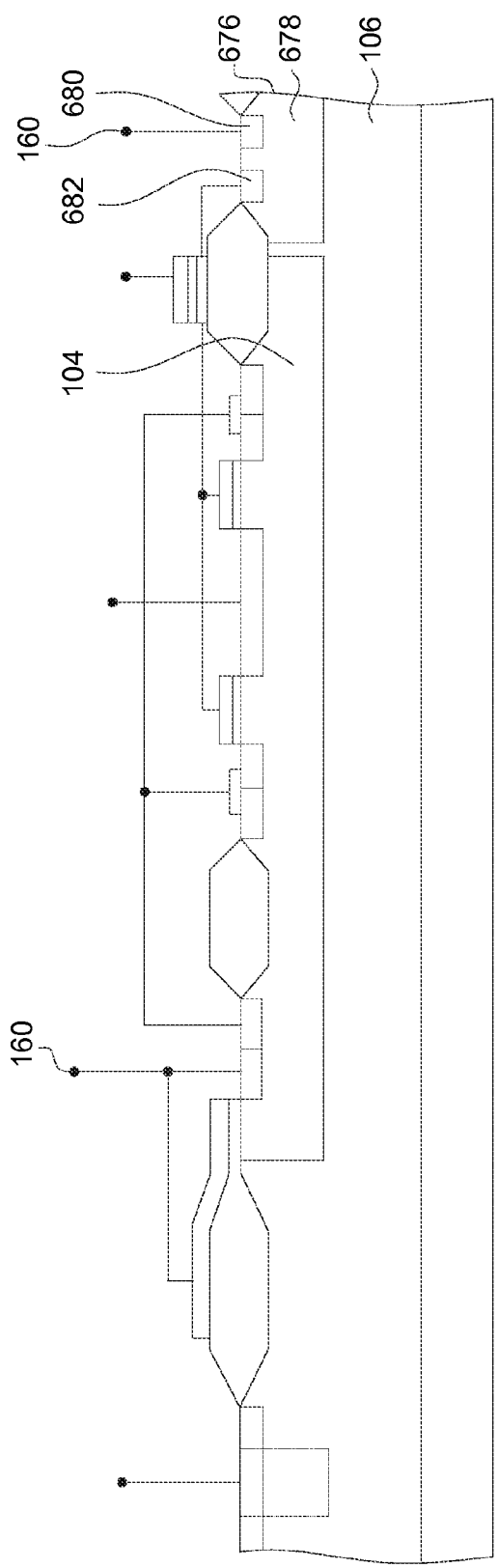
FIG. 6 illustrates a schematic cross-section diagram of a semiconductor structure according to an embodiment.

FIG. 6 illustrates a schematic cross-section diagram of a semiconductor structure according to an embodiment. Differences between the semiconductor structures of FIG. 6 and FIG. 1 are disclosed as following. The resistor 146 shown in FIG. 1 is replaced by a diode 676. The diode 676 comprises a doped well 678 and doped contacts 680, 682 formed in the doped well 678. The doped well 678 may be formed in the first well region 104 by an implantation process. The doped well 678 has a conductivity type same as the conductivity type of the first well region 104, and is separated from the first well region 104 by the second well region 106. In one embodiment, the doped contact 680 has a conductivity type (such as P type conductivity) same as the conductivity type of the doped well 678. The doped contact 682 has a conductivity type (such as N type conductivity) opposing to the conductivity type of the doped well 678.

Figure 7:
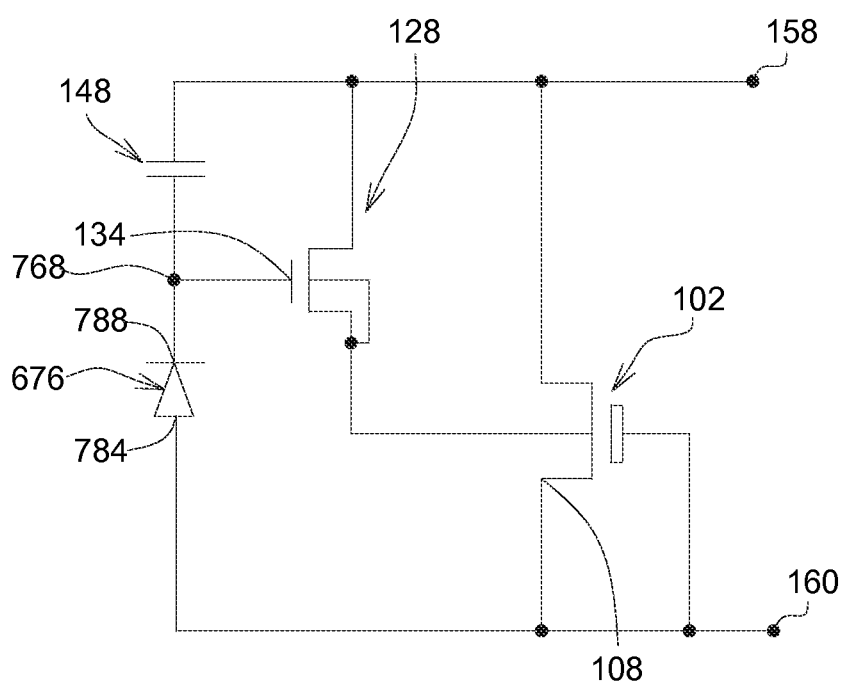
FIG. 7 illustrates an electrostatic discharge protection circuit according to an embodiment.

FIG. 7 illustrates an electrostatic discharge protection circuit according to an embodiment, which may indicate the semiconductor structure as shown in FIG. 6. Differences between the semiconductor structures of FIG. 7 and FIG. 3 are disclosed as following. The resistor 146 as shown in FIG. 3 is replaced by the diode 676. Opposing electrodes 784 and 788 of the diode 676 are coupled to the source 108 of the first device structure 102 (first MOS device) and the gate structure 134 of the second device structure 128 (second MOS device). The capacitor 148 and the diode 676 are electrically connected in series between the higher voltage terminal 158 and the lower voltage terminal 160. A node 768 between the capacitor 148 and the diode 676 is coupled to the gate structure 134 of the second device structure 128.

Figure 8:
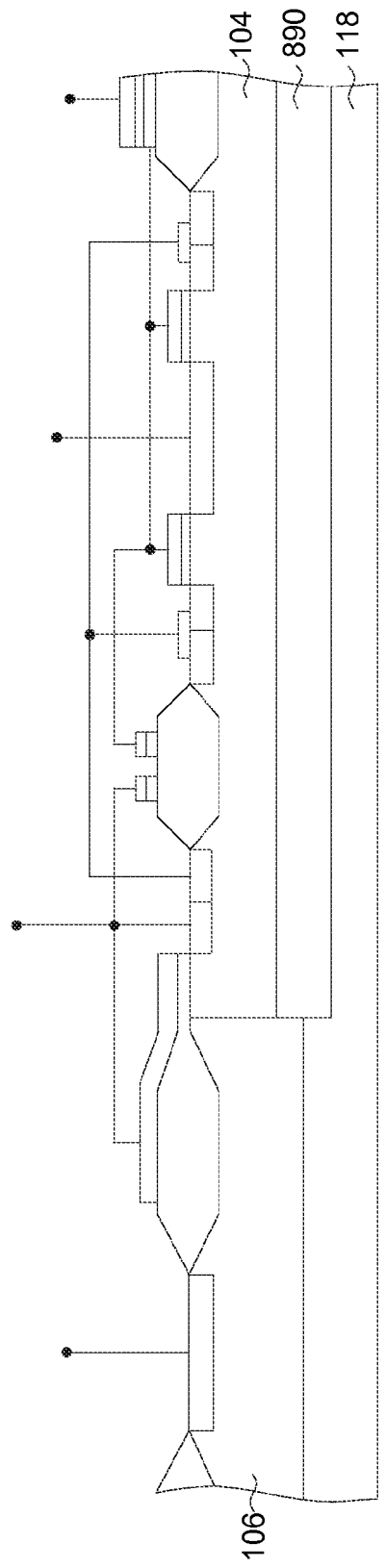
FIG. 8 illustrates a schematic cross-section diagram of a semiconductor structure according to an embodiment.

FIG. 8 illustrates a schematic cross-section diagram of a semiconductor structure according to an embodiment. Differences between the semiconductor structures of FIG. 8 and FIG. 1 are disclosed as following. The second well region 106 comprises a buried doped layer 890 having the same conductivity type (such as N type conductivity type). The buried doped layer 890 is formed on the semiconductor substrate 118 having the conductivity type opposite to the conductivity type of the buried doped layer 890. The second well region 106 comprising the buried doped layer 890 can provide isolation effect to the first well region 104. The buried doped layer 890 may be formed by an epitaxial process, but not limited thereto. The concepts for the buried doped layer 890 may be applied to the other embodiments. The extending doped region 114 is omitted.

The semiconductor structure (electrostatic discharge protection circuit) according to embodiments can provide electrostatic discharge protection to HV devices efficiently.

In embodiments, the semiconductor structure may be manufactured by a standard process, without additional mask. The various doped elements may be formed by an implantation process or an epitaxial process properly. The doped contacts are heavily doped regions, or other structures having good conductivity. The conductive contact may be any kind of structure having good conductivity, such as a metal silicide, a metal, etc. The polysilicon material may be formed by a single poly process, or a double poly process. For example, a MOS capacitor structure formed by the single poly process may be used to replace the PIP capacitor. Electrical connections between the elements disclosed above can be achieved through conductive elements such as conductive wires, conductive plugs, conductive layers (such as M1, M2), etc. The disclosed dielectric, insulating, isolating materials may comprise an oxide such as silicon oxide, a nitride such as silicon nitride, or other materials suitable to provide electrical isolation. The extending doped region can be used optionally. The first well region of the first device structure may be replaced by a body doped region having a conductivity type opposite to the conductivity type of the second well region, so as to make the first device structure be electrostatic discharge protection device having characteristics of a lateral diffusion MOS (LDMOS). In some embodiments, as the first device structure and the second device structure are both P type MOS devices, the said higher voltage terminal and the said lower voltage terminal are reversed to be a lower voltage terminal and a higher voltage terminal.

While the invention has been described by way of example and in terms of the exemplary embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first device structure comprising:
      a first well region;
      a second well region having a conductivity type opposite to a conductivity type of the first well region;
      a first source;
      a first drain having a conductivity type same as a conductivity type of the first source, the first source and the first drain being formed in the first well region and the second well region respectively;
      an extending doped region adjoined with the first drain and extended under the first drain, the extending doped region having a conductivity type same as the conductivity type of the first drain; and
      a first gate structure on the first well region;
   a second device structure comprising:
      a second source formed in the in the first well region and having a conductivity type opposite to the conductivity type of the first well region;
      a second drain formed in the first well region and having a conductivity type opposite to the conductivity type of the first well region; and
      a second gate structure formed on the first well region; and
   a diode opposing two electrodes of which are coupled to the first source and the second gate structure respectively.

2. The semiconductor structure according to claim 1, wherein the first gate structure comprises a gate dielectric and a gate electrode on the gate dielectric, a lower surface of the extending doped region is under a lower surface of the gate dielectric.

3. The semiconductor structure according to claim 2, wherein the gate dielectric comprising:
   a thinner dielectric portion adjacent to the source; and
   a thicker dielectric portion adjacent to the drain, wherein the lower surface of the extending doped region is under a lower surface of the dielectric portion.

4. The semiconductor structure according to claim 1, wherein the semiconductor structure is functioned as an electrostatic discharge protection device.

5. The semiconductor structure according to claim 1, wherein the first device structure is functioned as a N-type EDMOS device.

6. The semiconductor structure according to claim 1, wherein the first device structure further comprises a doped contact formed in the first well region and has a conductivity type same as the conductivity type of the first well region.

7. An electrostatic discharge protection circuit, comprising a first MOS device and the second MOS device, wherein each of the first MOS device and the second MOS device comprises:
   a source;
   a drain;
   an active body;
   a gate structure on the active body between the source and the drain, wherein a higher voltage terminal is coupled to the drains of the first MOS device and the second MOS device, a lower voltage terminal is coupled to the source and the gate structure of the first MOS device, the active body of the first MOS device is coupled to the source of the second MOS device; and
   a diode opposing two electrodes of which are coupled to the source of the first MOS device and the gate structure of the second MOS device respectively.

8. The electrostatic discharge protection circuit according to claim 7, further comprises a capacitor two opposing electrodes of which are coupled to the drain and the gate structure of the second MOS device respectively.

9. The electrostatic discharge protection circuit according to claim 7, further comprising a resistor two opposing sides of which are coupled to source of the first MOS device and the gate structure of the second MOS device respectively.

10. The electrostatic discharge protection circuit according to claim 7, further comprising a capacitor and a resistor electrically connected in series between the higher voltage terminal and the lower voltage terminal, wherein a node between the capacitor and the resistor is coupled to gate structure of the second MOS device.

11. The electrostatic discharge protection circuit according to claim 7, wherein the active body and the source of the second MOS device are coupled to a common voltage.

12. The electrostatic discharge protection circuit according to claim 7, further comprising a capacitor, wherein the capacitor and the diode electrically connected in series between the higher voltage terminal and the lower voltage terminal, and a node between the capacitor and the diode is coupled to the gate structure of the second MOS device.

13. A semiconductor structure, comprising:
a first well region;
a second well region having a conductivity type opposite to a conductivity type of the first well region;
a first device structure and a second device structure, each of the first device structure and the second device structure comprising:
a source;
a drain, the source and the drain having a conductivity type same as the conductivity type of the second well region, and opposite to the conductivity type of the first well region;
a gate structure on the first well region between the source and the drain, wherein the source of the first device structure, and the source and the drain of the second device structure are disposed in the common first well region; and
a diode opposing two electrodes of which are coupled to the source of the first device structure and the gate structure of the second device structure respectively.

14. The semiconductor structure according to claim 13, wherein the semiconductor structure is functioned as an electrostatic discharge protection device.

15. The semiconductor structure according to claim 13, further comprising a resistor coupled to the gate structure and the source of the first device structure.

16. The semiconductor structure according to claim 13, further comprising a resistor or capacitor coupled to the gate structure of the second device structure.

17. The semiconductor structure according to claim 13, wherein the first device structure is an EDMOS device, the second device structure is a MOS device.

18. The semiconductor structure according to claim 13, wherein the diode comprising:
a doped well having a conductivity type same as the conductivity type of the first well region and separated from the first well region by the second well region; and
two doped contacts having opposing conductivity types and formed in the doped well.

* * * * *